United States Patent

[11] 3,618,131

[72] Inventor Lawrence Garde
Bloomington, Minn.
[21] Appl. No. 86,880
[22] Filed Nov. 4, 1970
[45] Patented Nov. 2, 1971
[73] Assignee Control Data Corporation
Minneapolis, Minn.

[54] VOLTAGE CONTROLLED OSCILLATOR
10 Claims, 6 Drawing Figs.

[52] U.S. Cl. .......... 331/113, 331/111
[51] Int. Cl. .......... H03k 3/282
[50] Field of Search .......... 331/177, 113, 111, 143

[56] References Cited

UNITED STATES PATENTS 3,376,518 4/1968 Emmer .......... 331/111

*Primary Examiner*—John Kominski
*Attorneys*—Joseph A. Genovese and Paul L. Sjoquist

ABSTRACT: A self-starting voltage controlled oscillator having a frequency which is a linear function of its control voltage and which uses two identical trigger circuits with a single capacitor connecting an input terminal of each trigger circuit to an input terminal of the other trigger circuit. Each trigger circuit may be a bistable Schmitt trigger. A pair of feedback loops connect the outputs from each trigger to its input. The other output from each trigger circuit controls a switch to change the capacitor charging signal path as the states of the triggers change. The frequency of the oscillator is also a linear function of the capacitor value or of the resistor connected between the control voltage and the switch. The oscillator may be used in a phase lock loop circuit to lock on to and control the frequency and phase of an incoming signal from a read head used with a magnetic recording apparatus. It may also be used in any application where a controllable oscillator is required.

INVENTOR.
LAWRENCE GARDE
BY Paul L. Sjoquist
Joseph A. Genovese
ATTORNEYS

INVENTOR.
LAWRENCE GARDE
BY Paul L. Sjoquist
Joseph A. Genovese
ATTORNEYS

INVENTOR.
LAWRENCE GARDE
BY Paul L. Sjoquist
Joseph A. Genovese
ATTORNEYS

VOLTAGE CONTROLLED OSCILLATOR

BACKGROUND OF THE INVENTION

Field of the Invention

This invention relates to the electronic self-starting oscillator art. In particular it relates to an oscillator circuit that generates a signal having a frequency which is a linear function of the value of a circuit control voltage and of the value of a single capacitor used in the circuit.

Description of Prior Art

The general description of prior art is the class of multivibrators which use the Eccles Jordan AC coupled configuration. Such circuits are bistable oscillators having two capacitors to connect the two trigger circuits to each other. Usually these capacitors are in the lines connecting the base of one transistor in one trigger circuit to the collector of another transistor in the other trigger circuit. The Eccles Jordan type of circuit must be triggered by an input pulse initially to start oscillation and hence produce an output signal, i.e., it is not self-starting. In addition the oscillator frequency is an exponential function of the control voltage and the recovery or flyback time is relatively long because of its dependence on the charging rate of the two mentioned linking capacitors, causing the output waveform rise and fall time to be dependent on the value of the capacitors used.

SUMMARY OF THE INVENTION

The present invention is a self-starting wide bandwidth oscillator which generates a signal having a frequency which is a linear function of the value of various circuit components. The two trigger circuits making up the oscillator are substantially identical to each other and each have bistable states over which they operate. The use of a common capacitor insures symmetrical phase pulses at the outputs, which pulses have rise and fall times characteristic of the trigger circuits used, and not dependent on the frequency of operation. The oscillator may be used in conjunction with a phase lock loop to control the frequency and phase of the average frequency of data obtained by the read head of a magnetic disc.

OBJECTS OF THE INVENTION

The primary object of this invention is an improved voltage controlled oscillator.

A secondary object of this invention is an improved oscillator utilizing two Schmitt triggers and a single coupling capacitor which has a recovery time that is not a function of the discharge time of the capacitor.

A still more specific object is to use such an oscillator in a phase lock loop circuit to control the phase and frequency of an incoming pulse and match it to that of the oscillator.

Additional objects will become apparent to those skilled in the art upon reading of this specification and claims.

Figure 2:
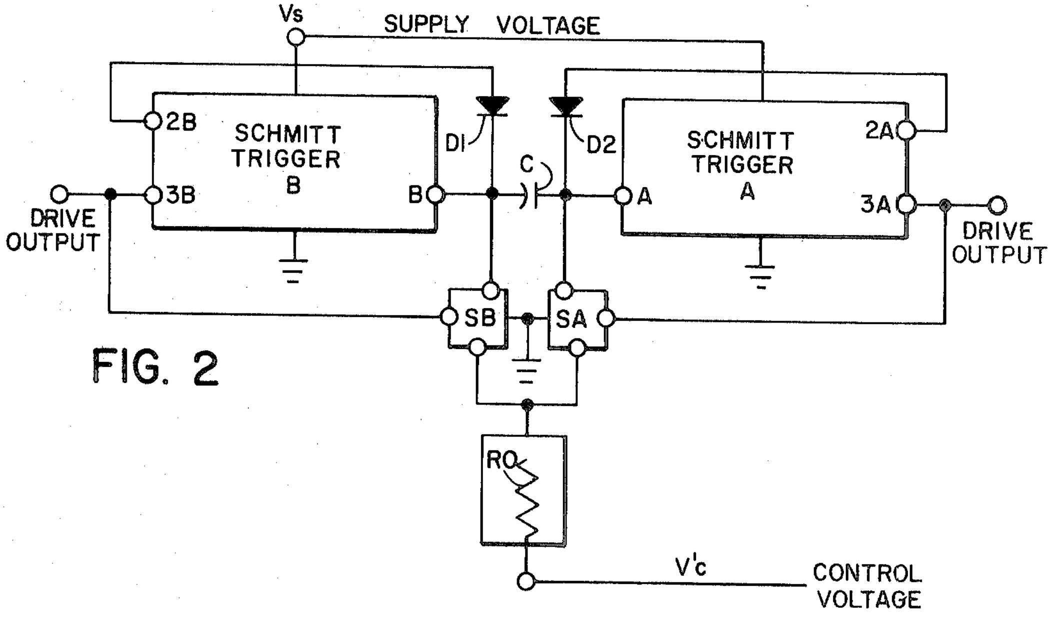
FIG. 2 shows in block format the oscillator set up of this invention.
Figure 3:
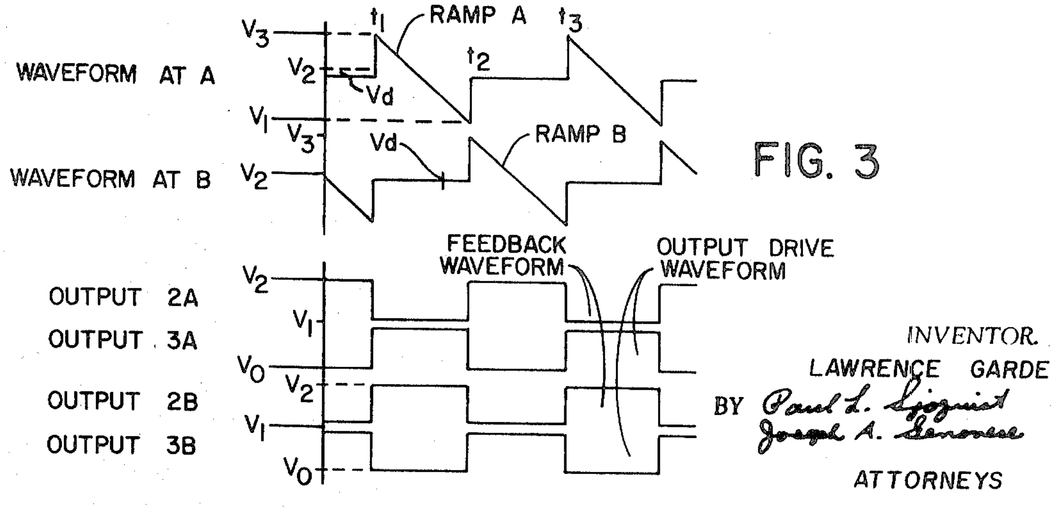

FIG. 3 indicates the various waveforms at the outputs and inputs of the circuit of FIG. 2.

Figure 4:
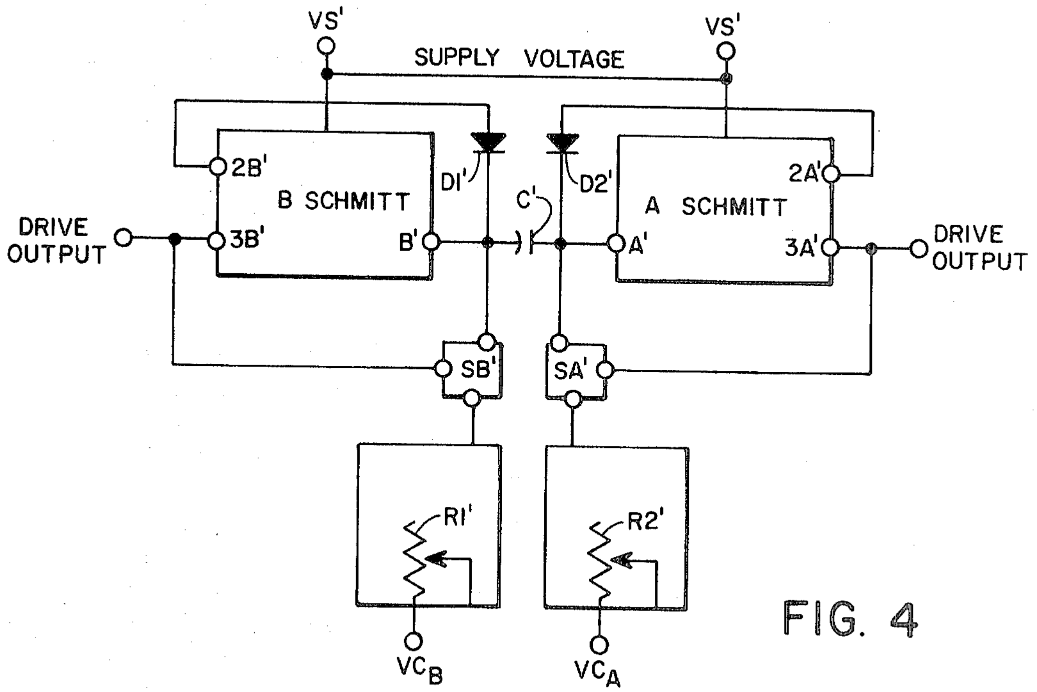

FIG. 4 shows the oscillator of FIG. 2 used as a pulse generator.

Figure 5:
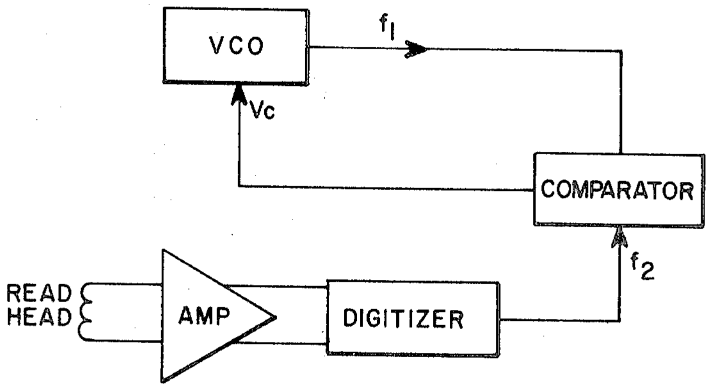

FIG. 5 is the oscillator of this invention used in conjunction with a phase lock loop circuit.

Figure 6:
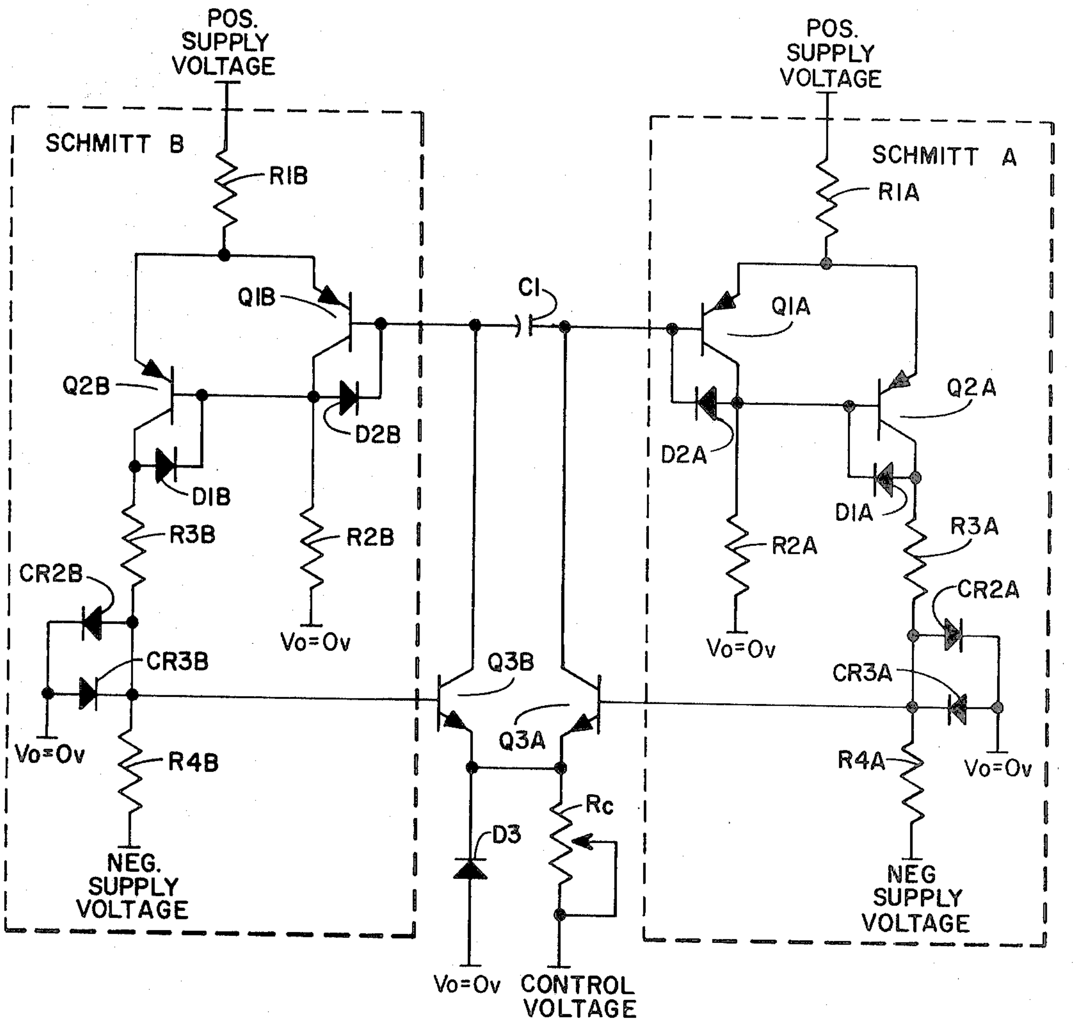

FIG. 6 illustrates a detailed showing of one possible practical embodiment of the oscillator of FIG. 2.

Figure 1:
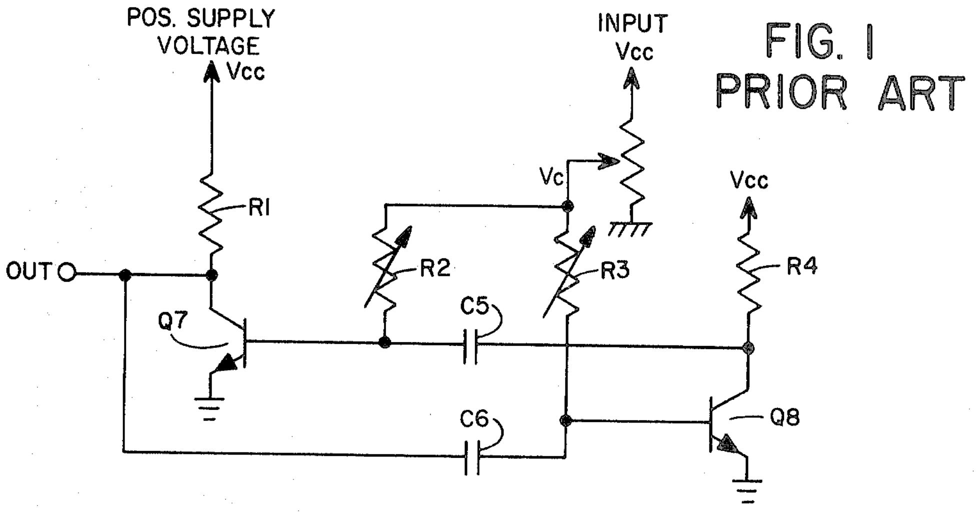
FIG. 1 PRIOR ART
FIG. 1 is an example of the commonly used prior art Eccles Jordan oscillator.

FIG. 1 shows a typical circuit for an Eccles Jordan AC coupled oscillator. Such a multivibrator circuit is bistable in nature and requires an initial input pulse to insure starting. Assume that initially both collectors of transistors Q7 and Q8 are at the same potention (V). As one of the transistors, say Q7, starts to conduct it drives the plate of capacitor C6 negative. The potential at the base of the other transistor Q8 is driven negative to cut off Q8. The current through resistor R4 charges C5; this same charging current also passes via the emitter base junction of transistor Q7 further driving Q7 into saturation. At This same time the capacitor C6 tends to charge exponentially towards the control voltage Vc via resistor R3 until the potential at the base of transistor Q8 reaches a value to cause Q8 to conduct again. Transistor Q8 rapidly conducts to a saturated state and the collector Q8 goes negative toward ground potential. This negative collector terminal of Q8 transistor is transferred via capacitor C5 to the base of transistor Q7 cutting off the collector current of Q7. The potential at the collector of transistor Q7 then rises rapidly as capacitor C6 is charged via resistor R1. The charging current flows via the base emitter junction of transistor Q8 to drive Q8 into saturation. Capacitor C5 charges positive towards V*c* via resistor R2 until the base emitter junction potential of transistor Q7 is exceeded. When this happens transistor Q7 is again driven into saturation and the cycle starts once again.

The prior art Eccles Jordan circuit of FIG. 1 has certain characteristics and limitations. It is not necessarily self-starting as both sides (a transistor with its associated capacitor and circuitry) can remain in a steady state. The use of two timing capacitors (C5 and C6) in the circuit limits high frequency operation due to the requirement to charge the capacitors during the transition time. In addition, the use of two capacitors, at least one of which is in an active circuit at any given time, results in an exponential charge rate. The output waveform rise and fall times are a function of the respective capacitor charging circuits.

In contrast to the Eccles Jordan circuit of FIG. 1 my invention makes use of only one capacitor (see FIGS. 2 and 6) that constantly has current flowing through it no matter which of the trigger circuits is operating. To understand the basic idea behind my invention consider the block diagram illustrated in FIG. 2. There are two substantially identical trigger circuits A and B. In the preferred embodiment these trigger circuits are the well known Schmitt triggers i.e., a bistable circuit that has a switching sensitivity related to the amplitude of the input waveform. Trigger circuit B has two outputs 2B and 3B and one input terminal B. Likewise, trigger circuit A has two outputs 2A and 3A and one input terminal A. The input terminals A and B are interconnected by a single charge storage means C. This storage means may be a variable capacitor. The outputs 2A and 2B are connected back into their respective input terminals by a feedback loop. Two diodes D1 and D2 may be included in the feedback loops to insure that the potential at the inputs A and B never goes more positive than one diode junction voltage (about 0.7 volt) below the potential at outputs 2A and 2B, respectively. Switches SB and SA are provided between the input terminals B and A, respectively, and resistor means Ro. By connecting a control element of each switch means (i.e., the connection to the base of a transistor switch) to each of the outputs 3A and 3B it is possible to control the current path. As will be explained hereafter, switches SA and SB may assume a short circuit or open circuit condition. A negative control voltage Vc' may be applied to one of terminals of the resistor R*o*. This voltage and resistor combination acts somewhat like an idealized constant current source, which acts in combination with the remaining circuit to maintain the current through the capacitor constant. By insuring a constant current in C the change in voltage per unit change in time can be kept constant. As will be elaborated on hereafter this provides a frequency of operation which is a linear function of the value of the capacitor C or of the value of the current divided by R*o*.

To understand the operation of the oscillator of FIG. 2 it is necessary to observe the waveforms shown in FIG. 3. The voltage V3 is the most positive potential, V2 the next most positive, then V1 and lastly Vo. Vd is the value of the diode drop voltage across either D1 or D2. At time *t*1 output 2A is at a V1 potential, output 3A at V1, switch SA is in a short circuit condition and diode D2 is back biased. The input A is at V3 and input B is at value of V2 minus the voltage drop (V*d*) across D1. Output 2B is at V2, output 3B at Vo, diode D1 is forward biased, and switch SB is an open circuit condition. Input B is held at a voltage just below V2. Current passes through resistor Ro and switch SA at t1 depending on the value of the control voltage Vc'. The terminal of capacitor C nearest input B is held at the same potential as B namely V2–Vd. Capacitor C charges linearly as current passes through it until input A has a potential of V1. When this happens trigger circuit A retriggers OFF switching output 2A to V2 and output 3A to Vo. Switch SA goes open circuit and input A is driven positive (See Ramp A of FIG. 3).

At the instant t 2 when trigger A is turned OFF the voltage across the terminals of capacitor C is the difference between input B and input A or V2–Vd–V1 (See Ramp A and B of FIG. 3). As the potential of input A is raised to V2–Vd the potential at input B is raised to V3. When input B is raised to V3 its diode D1 is back biased and trigger B is triggered ON with its outputs 2B and 3B both going to V1. Switch SB is driven to a short circuit condition by the output 3B and the current flow is through diode D2, capacitor C, switch SB and resistor Ro Input A is held at V2–Vd as input B ramps negatively between time t2 to t3. When t=t3 the voltage of input B reaches V1 turning trigger B OFF and driving its output 2B to V2 and its output 3B to Vo. Input B then goes to V2–Vd, switch SB is open circuited, and input A is raised to V3 to turn trigger circuit A ON. This completes the oscillator cycle. The whole cycle then repeats itself in a continuous manner.

The ramps A and B shown in FIG. 3 are linear and have a rate determined by the values of the control voltage (Vc'), capacitor C, resistor Ro. The value of the voltage drop across C is equal to i (the current through C) divided by ramp time or the rate of change of voltage across C per unit time (dv/dt). This comes from the well known equation $i=C\,dv/dt$. By making the current source substantially constant it follows that (dv/dt would be constant as c has a constant value; i.e., the ramps are linear functions.

THe oscillator frequency f can be expressed as a linear function whose value depends on the values of Vc', C and Ro. Such a relationship would be $f=A_1(Vc'/BC)+B1$ where $A_1$ and $B_1$ are constants of the Schmitt triggers A and B. It is thus seen that the frequency of oscillation is a linear function of the values Rc', the control voltage Ro and C. By varying any one of these three quantities the oscillator can vary its frequency within a wide band of frequencies. Frequency values as low as 0.001 hertz (Hz.) and as high as 20 megahertz (MHz) have been observed. One additional point worthy of note is that the rise and fall time of the oscillator output wave is independent of the frequency of operation. The rise and fall time is a characteristic of only the Schmitt triggers.

Since my invention, as described above, has only one capacitor C coupled to both trigger circuits and has a recovery time not dependent on the charging or discharging of C, the recovery or flyback time is independent of the value of C. By making C constantly active in the circuit no matter which of the triggers is ON an oscillator is provided which does not have to wait for a charge on C to switch active trigger circuits. The charging and discharging of C is under the control of the circuit parameters but is not a factor in the switching time. Hence a faster recovery or flyback time is possible than that associated with circuits requiring the exponential discharge or charging of a timing capacitor.

The uses of the voltage controlled oscillator of my invention described in FIG. 2 are immediately apparent. Broadly speaking it may be used whenever it is desired to generate a frequency from a voltage. In the computer art it may be employed to act as a write oscillator for writing on a magnetic recording medium (disc, tape, drum, etc.) by coordinating the oscillator frequency with the speed of the moving recording medium. It may also be used in test equipment as a wide band pulse generator and also as the driving pulse to drive transistor-transistor, diode-transistor or current transistor logic levels. Two additional uses are shown in the pulse generator of FIG. 4 and the phase lock loop of FIG. 5.

The block diagram of FIG. 4 is essentially the same as that of FIG. 2 excepting two current limiters, resistors R1' and R2', are used to control the current from two control voltages $V_{CB}$ and $V_{CA}$. The primed designators (SA', SB', 2A', 3A', 2B', A', B', and VS') serve the same functions as their counterparts explained in describing FIG. 2. By varying resistors R1' or R2', voltages $V_{CB}$ or $V_{CA}$, or capacitor C' a versatile pulse generator is formed with means to control the pulse reception frequency and pulse duration in a linear manner. Needless to say a common control voltage ($V_{CB}=V_{CA}$) may be used with separate variable resistors, like R1' and R2', or any combination thereof as is apparent to those skilled in the art.

The phase lock loop circuit of FIG. 5 utilizes the oscillator of FIG. 2 (indicated as VCO) to control the frequency and phase of in incoming signal. In this particular illustrated case in the computer art, a read head receives an AC signal from a magnetic disc or tape which has recorded on it binary information. This signal is amplified by the amplifier and then sent to a digitizer circuit. The digitizer converts the received and amplified analog signal into a pulse signal f2 representative of the average frequency of data from the read head. Frequency f2 is then fed into a comparator where it is compared with signal f1 from the VCO. The control voltage to the VCO is a function of the integral of the difference between f1 and f2. By a suitable adjustment of Vc, f1 can be made equal to f2 in both phase and frequency. The frequency f1 can then be used as a timing base having no imperfections such as noise or jitter to gate the data coming from the digitizer into a flip-flop register. Frequency f1 can also be used as a control clock a rewrite information on the medium (magnetic disc, tape, etc.) from which it is coming. It is necessary to so control the data from the read head because frequency F2 is dependent on the speed of the magnetic medium (disc or tape) used. Frequencies contained in the signal other than the fundamental f2 are ignored as the VCO effectively acts as a filter to operate the loop only at f2. Hence a pure clock at the average frequency of the medium is obtained for writing more information on the medium.

FIG. 6 represents what may be described as a practical embodiment of the block diagram oscillator of FIG. 2. The dotted lines enclose in two blocks the Schmitt triggers A and B. Capacitor C1 functionally serves the same purpose as C of FIG. 2 and the circuit operation is essentially the same as that of the FIG. 2. Certain basic refinements do, however, exist in the circuit of FIG. 6 over the FIG. 2 circuit. As for example, transistors Q1A and Q1B use a base emitter junction to replace the diodes D1 and D2 of FIG. 2 and the differential switch/current limiter circuit formed by transistors Q3A and Q3B and resistor Rc help to give the circuit its high-frequency characteristics by combining functions. The diodes D1A, D2A, D1B, and D2B are antisaturation diodes of the Schottky type (i.e., goes into conduction at a lower voltage than the base collector voltage of saturation of the transistor it is associated with as for example, Q1A and D2A) used to prevent the Schmitt transistors from going fully into saturation and thereby helping the circuit to oscillate better at high frequencies. The diode D3 is used to insure that the emitters of transistors Q3A and Q3B cannot fall to a voltage which would cause them both to conduct when the power supply voltage is first switched on. If there was conduction by both transistors Q3A and Q3B initially the circuit would be prevented from oscillating.

The basic set up of the FIG. 6 circuit is straightforward. The transistors Q1A and Q2A, the resistors R1A, R2A, and the diodes D2A and D1A form the single Schmitt trigger A circuit. The collector of Q1A is connected to the base of Q2A and the feedback loop is formed by connecting the emitter of Q1A to the emitter of Q2A and to a common resistor R1A. The resistors R1A and R2A control the upper input voltage switching level. Resistors R1A and R3A control the lower input voltage switching level. The components Q1B, Q2B, R1B, R2B, R3B, D2B, and D1B form the Schmitt trigger B circuit. Their functions are the same as their counterparts in the Schmitt A circuit. The other circuit components namely, CR2B, CR3B, CR2A, CR3A, R4B, R4A, Q3B, Q3A, D3 and $R_c$ form the combined steering switches and a substantially constant current source. The coupling capacitor $C_1$ interconnects the input terminals to triggers A and B.

When the Schmitt trigger A transistor Q2A conducts during the normal multivibrator cycle the switching transistor Q3A will also conduct and its counterpart Q3B is nonconducting. By making the voltage drop across ground connected diode CR2A equal to the threshold voltage of the base-emitter voltage of Q3A (about 0.7 volt) it is possible to insure that the potential between Q3A emitter and resistor $R_c$ is at ground. This provides for a substantially constant current generator by varying the control voltage and/or $R_c$. The constant current charges coupling capacitor $C_1$ so that the input voltage to trigger A (as in FIG. 3) ramps negatively in a linear manner. Under the other condition or state of the multivibrator cycle when trigger B operates Q2A and Q3A are nonconducting and Q2B conducts. Switching transistor Q3B also conducts. As would be expected the constant current source when trigger B is operating the transistor Q3*b* and the resistor $R_c$. The common capacitor $C_1$ is provided charge by this source to ramp the input voltage to trigger B negatively.

The oscillator of this invention has certain characteristics in addition to those already enumerated. The symmetry of the trigger circuits provides for a tracking of each circuit by the other to compensate for any temperature changes that may occur. By providing a single capacitor and resistor $R_o$ and $R_c$) as in FIG. 2 and FIG. 6 embodiments, equal but 180° out of phase pulses are obtained at the output terminals with good symmetry. These symmetrical output pulses have a rise and fall time which is unaffected by the operating oscillator frequency.

It will be apparent to those skilled in the art that various changes may be made in my invention without departing from the spirit and scope thereof. For example, the inventive circuit could be used in modern integrated circuits using a logic chip. The particular uses listed for my voltage controlled oscillator should not be construed as limited by their enumeration. Therefore, my invention should not be limited by that which is shown in the drawings and described in the specification, but only as indicated in the appended claims.

I claim:

1. A self-starting voltage controlled oscillator circuit comprising:

a. a first trigger circuit having an output signal controlled by an output signal at an input terminal and capable of operating at either one of two stable states;

b. a second trigger circuit substantially identical to the first trigger circuit and having an output signal controlled by an input signal at an input terminal and capable of operating at either one of two stable states;

c. feedback loop means in each of the trigger circuits for feeding an output signal to the input terminal;

d. switch means for each of the trigger circuits, each input terminal of each trigger circuit being connected to a switch means, and each of the switch means having a control element connected to an output of its respective trigger circuit;

e. a substantially constant current source means including a control voltage connected to the switch means for each of the trigger circuits; and f. a single charge storage means interconnecting the input terminals of the trigger circuits, whereby the charge storage means is alternately charged by the operation of the first and second trigger circuits through their respective feedback loops and switch means, one trigger circuit operating at one of its stable states and controlling its respective switch means such that a charging path through the single charge storage means is completed to the other trigger circuit when the other trigger circuit is in a different stable state to continuously emit from the output of the oscillator a signal having a frequency which is a linear function of the control voltage value.

2. The circuit of claim 1 wherein the first and second trigger circuits are Schmitt triggers.

3. The circuit of claim 1 wherein the current source means comprises two current sources with each current source connected to a separate switch means to act as a pulse generator.

4. The circuit of claim 1 wherein the switch means comprises transistor switches and the charge storage means comprises a capacitor.

5. The circuit of claim 1 wherein the current source means or charge storage means is variable and the oscillator frequency is a linear function of the control voltage.

6. The circuit of claim 1 in combination with a comparator circuit to form a phase lock circuit; and a read head connected to a digitizer circuit feeding a signal into the comparator of the phase lock circuit whereby the signal emitted by the oscillator circuit locks on to and causes the signal emitted by the digitizer circuit to assume the same frequency and phase.

7. The circuit of claim 2 wherein the switch means comprise transistor switches and the charge storage means comprises a capacitor.

8. The circuit of claim 7 wherein the current source or charge storage means is variable and the oscillator frequency is a linear function of the control voltage operating on the constant current source and also the value of the charge storage means.

9. The circuit of claim 8 wherein the current source means comprises two resistors with one resistor connected to each switch means to act as a pulse generator.

10. The circuit of claim 7 in combination with a comparator circuit to form a phase lock circuit; and a read head connected to a digitizer circuit feeding a signal into the comparator of the phase lock circuit whereby the signal emitted by the oscillator circuit locks on to and causes the signal emitted by the digitizer circuit to assume the same frequency and phase.

* * * * *